US010396072B2

(12) United States Patent
Hori

(10) Patent No.: US 10,396,072 B2
(45) Date of Patent: Aug. 27, 2019

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Yoichi Hori, Himeji Hyogo (JP)

(73) Assignees: KABUSHIKI KAISHA TOSHIBA, Tokyo (JP); TOSHIBA ELECTRONICS DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 15/911,458

(22) Filed: Mar. 5, 2018

(65) Prior Publication Data

US 2019/0088648 A1    Mar. 21, 2019

(30) Foreign Application Priority Data

Sep. 19, 2017   (JP) ................................ 2017-178753

(51) Int. Cl.
*H01L 27/08* (2006.01)
*H01L 29/06* (2006.01)
(Continued)

(52) U.S. Cl.
CPC ...... *H01L 27/0814* (2013.01); *H01L 29/0626* (2013.01); *H01L 29/1608* (2013.01); *H01L 29/868* (2013.01); *H01L 29/872* (2013.01)

(58) Field of Classification Search
CPC ................. H01L 29/868; H01L 29/872; H01L 2924/12032; H01L 2924/12031; H01L 29/8611; H01L 29/0615
See application file for complete search history.

(56) References Cited

U.S. PATENT DOCUMENTS 6,979,863 B2    12/2005   Ryu
8,835,934 B2     9/2014   Mizukami
(Continued)

FOREIGN PATENT DOCUMENTS

JP    5210518 B2    6/2013
JP    5550589 B2    7/2014
(Continued)

*Primary Examiner* — Charles D Garber
*Assistant Examiner* — Alia Sabur
(74) *Attorney, Agent, or Firm* — Kim & Stewart LLP

(57) ABSTRACT

A semiconductor device is provided having a first region and a second region surrounding the first region includes a first electrode, a second electrode, a first semiconductor layer of a first conductivity type between the first electrode and the second electrode, a second semiconductor layer of the first conductivity type located over the first semiconductor layer, a third semiconductor layer of the second conductivity type on the second semiconductor layer in the first region, a fourth semiconductor layer of the first conductivity type between the third semiconductor layer and the second semiconductor layer, a fifth semiconductor layer of the second conductivity type on the second semiconductor layer in the second region, and a sixth semiconductor layer of the first conductivity type located between the fifth semiconductor layer and the second semiconductor layer, wherein the width of the fourth semiconductor layer is less than the width of the sixth semiconductor layer.

19 Claims, 4 Drawing Sheets

(51) Int. Cl.
  *H01L 29/16* (2006.01)
  *H01L 29/868* (2006.01)
  *H01L 29/872* (2006.01)

(56) References Cited

U.S. PATENT DOCUMENTS

| | | | |
|---|---|---|---|
| 8,866,151 B2 | 10/2014 | Noda et al. | |
| 9,142,687 B2 | 9/2015 | Hori et al. | |
| 2012/0212164 A1* | 8/2012 | Terakawa | H01L 29/8611 318/400.3 |
| 2015/0001552 A1* | 1/2015 | Hori | H01L 29/872 257/77 |

FOREIGN PATENT DOCUMENTS

| | | |
|---|---|---|
| JP | 2015-29046 A | 2/2015 |
| JP | 5739813 B2 | 6/2015 |
| JP | 2016058498 A | 4/2016 |

* cited by examiner

SEMICONDUCTOR DEVICE

CROSS-REFERENCE TO RELATED APPLICATION

This application is based upon and claims the benefit of priority from Japanese Patent Application No. 2017-178753, filed Sep. 19, 2017, the entire contents of which are incorporated herein by reference.

FIELD

Embodiments described herein relate generally to a semiconductor device.

BACKGROUND

As a semiconductor device having a rectifying function, a diode including Schottky barrier junction and pn junction is known. The diode is provided with an n-type semiconductor region, a p-type semiconductor region formed in the n-type semiconductor region, and an electrode connected to the n-type semiconductor region and the p-type semiconductor region. In such a semiconductor device, further improvement of resistance is required with respect to a surge voltage, a surge current, and the like.

DETAILED DESCRIPTION

Figure 1:
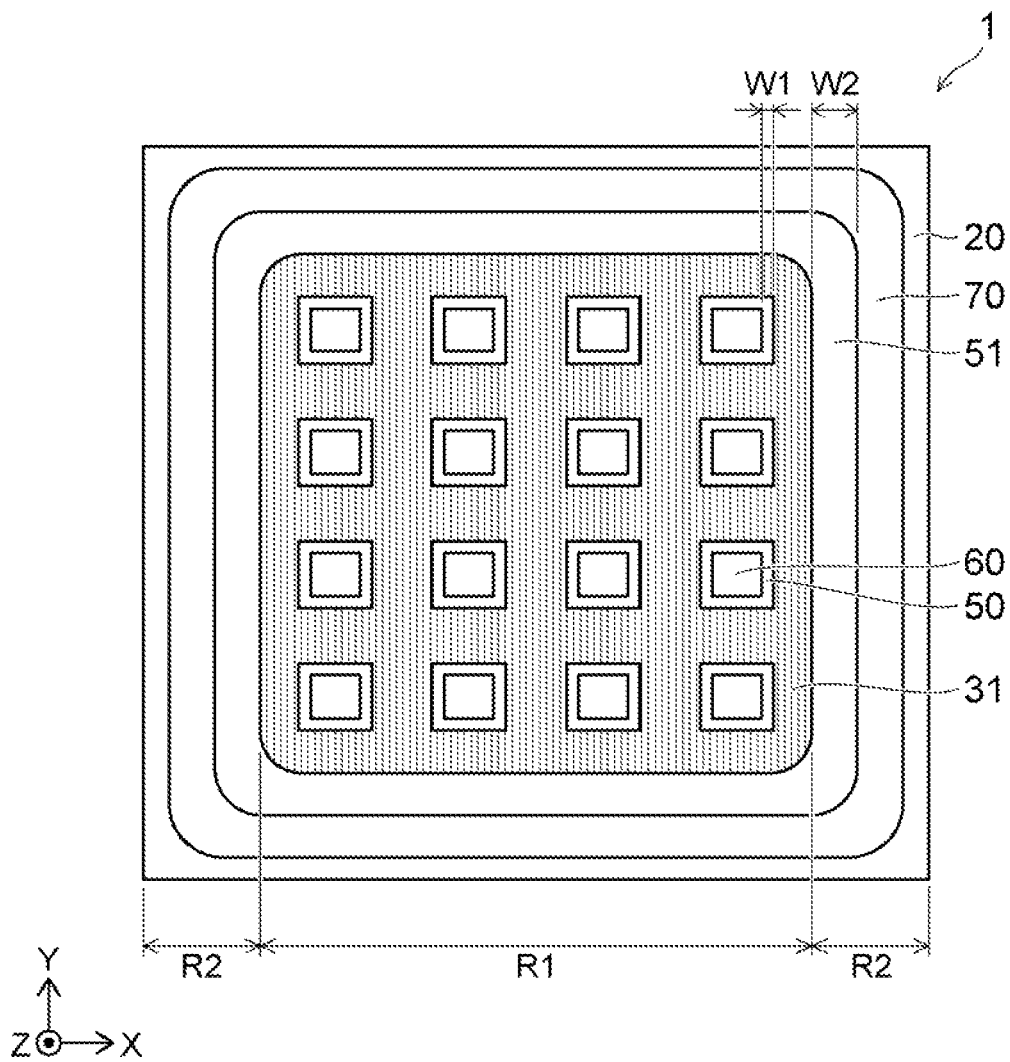
FIG. 1 is a plan view illustrating a semiconductor device according to a first embodiment.

Embodiments provide a semiconductor device with improved tolerance against breakdown.

In general, according to one embodiment, a semiconductor device a semiconductor device having a first region and a second region surrounding the first region includes a first electrode, a second electrode, a first semiconductor layer of a first conductivity type between the first electrode and the second electrode, a second semiconductor layer of the first conductivity type located over the first semiconductor layer, a third semiconductor layer of the second conductivity type on the second semiconductor layer in the first region, a fourth semiconductor layer of the first conductivity type between the third semiconductor layer and the second semiconductor layer, a fifth semiconductor layer of the second conductivity type on the second semiconductor layer in the second region, and a sixth semiconductor layer of the first conductivity type located between the fifth semiconductor layer and the second semiconductor layer, wherein the width of the fourth semiconductor layer is less than the width of the sixth semiconductor layer.

Embodiments will be described below with reference to the drawings. In addition, the drawings are schematic and conceptual. The relation between a thickness and a width of each component, the ratio of sizes between the components and the like are not necessarily the same as those in actual devices. Further, depending on the drawing, the same component may be illustrated having different dimensions and size ratios between elements.

In the specification and each drawing, corresponding elements and the like are given the same reference signs as the already-described element was given with respect to the description of a previous drawing, and repeat descriptions thereof in detail will be appropriately omitted.

First Embodiment

Figure 2:
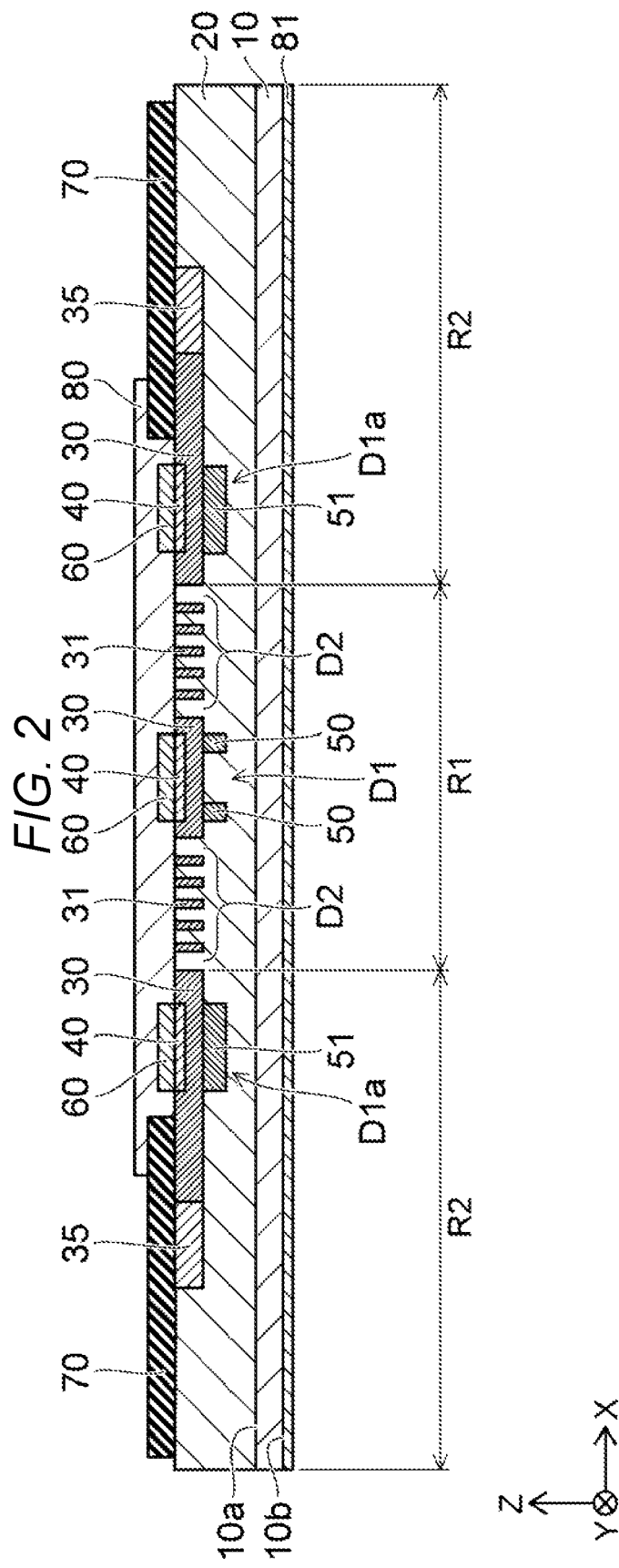
FIG. 2 is a sectional view illustrating the semiconductor device according to the first embodiment.

FIGS. 1 and 2 are a plan view and a sectional view illustrating a semiconductor device 1, respectively.

In the specification, a xyz orthogonal coordinate system is used. A direction from a cathode electrode 81 toward an anode electrode 80 is defined as a Z direction, and two directions perpendicular to the Z direction and orthogonal to each other are defined as an X direction and a Y direction. FIGS. 1 and 2 respectively illustrate an X-Y plane plan view and an X-Z section of the semiconductor device 1. For convenience of illustration, a portion of the components illustrated in FIG. 2 are omitted in FIG. 1. In FIG. 1, positions of semiconductor regions 20, 31, 50, and 51, a conductive layer 60, and an insulating layer 70 are illustrated when viewed from the Z direction.

As illustrated in FIGS. 1 and 2, the semiconductor device 1 is provided with an element region R1 and a termination region R2. For example, the element region R1 has a rectangular shape when viewed from the Z direction, and the termination region R2 surrounds the periphery of the rectangular element region R1.

First, the element region R1 will be described.

In the element region R1, the semiconductor device 1 includes a semiconductor region 10 of a first conductivity type, the semiconductor region 20 of the first conductivity type, a semiconductor region 30 of a second conductivity type, the semiconductor region 31 of the second conductivity type, a semiconductor region 40 of the second conductivity type, the semiconductor region 50 of the first conductivity type, the conductive layer 60, the anode electrode 80, and the cathode electrode 81.

The semiconductor region 10 is, for example, a semiconductor substrate containing silicon carbide (SiC). The semiconductor region 10 includes a first surface 10a and a second surface 10b. The second surface 10b is opposite to the first surface 10a. For example, the semiconductor region 10 has an $n^+$-type conductivity.

The notation of $n^+$, n, and $n^-$ and $p^+$, p, and $p^-$ represent the relative high and low effective impurity concentration of each conductivity type. In other words, the notation "+" means that the conductivity type has relatively higher impurity concentration than the conductivity type without the "+" notation, and the notation "−" means that the conductivity type has relatively lower impurity concentration than the conductivity type without notation "−".

In addition, the "effective impurity concentration" denotes the concentration of an impurity contributing to the conductivity of a semiconductor material, and when both the impurity serving as a donor and the impurity serving as an acceptor are contained, denotes the concentration excluding the offset result of the donor and the acceptor. An n-type impurity is, for example, phosphorus (P), and a p-type impurity is, for example, boron (B).

The semiconductor region 20 is provided on the first surface 10a of the semiconductor region 10. For example, the semiconductor region 20 contains silicon carbide and is formed by an epitaxial growth method starting from the first surface 10a of the semiconductor region 10. For example, the semiconductor region 20 has an n⁻-type conductivity.

A plurality of semiconductor regions 30 are provided on or extending into the semiconductor region 20. The plurality of semiconductor regions 30 are selectively located on the semiconductor region 20. For example, the plurality of semiconductor regions 30 have a rectangular shape when viewed in the Z direction, and are arrayed in the X direction and Y direction. For example, the semiconductor region 30 contains silicon carbide and has a p-type conductivity.

It should be noted that the plurality of semiconductor regions 30 are arrayed in the X direction and Y direction, but only one semiconductor region 30 is illustrated in the element region R1 in FIG. 2, for convenience of illustration.

A plurality of semiconductor regions 31 are provided on or extending into the semiconductor region 20. The plurality of semiconductor regions 31 are selectively located on the semiconductor region 20. For example, each of the plurality of semiconductor regions 31 are spaced from each other in the X direction and extend in the Y direction. For example, the semiconductor region 31 contains silicon carbide and has the p-type conductivity. For example, the semiconductor region 31 has the same conductivity as that of the semiconductor region 30.

As illustrated in FIG. 2, the semiconductor regions 31 are located to the periphery of the semiconductor region 30. That is, in FIG. 1, the semiconductor regions 31 do not overlap with the semiconductor regions 30 when viewed in the Z direction.

The semiconductor region 40 is provided on or extends into the semiconductor region 30. The semiconductor region 40 is provided on each of the plurality of semiconductor regions 30. For example, the semiconductor region 40 contains silicon carbide and has a p⁺-type conductivity.

The semiconductor region 50 is provided on the semiconductor region 30 and extends into the semiconductor region 20. The semiconductor region 50 is provided on each of the plurality of semiconductor regions 30. The semiconductor region 50 is located on the lower surface of the semiconductor region 30 and extends into the semiconductor region 20. For example, the semiconductor region 50 is located on the semiconductor region 30 to protrude from the underside thereof in a direction opposite to the +Z direction (extends in in direction from the anode electrode 80 toward the cathode electrode 81). The semiconductor region 30 is interposed between the semiconductor region 40 and the semiconductor region 50 in the z direction.

As illustrated in FIG. 1, for example, the semiconductor region 50 has an annular shape when viewed from the Z direction. Within the ring-shaped semiconductor region 50, a portion of the semiconductor region 20 is located. For example, the semiconductor region 50 contains silicon carbide and has an n-type conductivity. The semiconductor region 50 is formed by, for example, implanting n-type impurities into the semiconductor region 20 by such as an ion implantation method. In the case, the impurity concentration of the semiconductor region 50 becomes higher than that of the semiconductor region 20. The semiconductor region 50 has a width W1 in the X-direction. The width W1 may be a width in the Y direction.

In the element region R1, the semiconductor regions 10, 20, 30, 40, and 50 of the semiconductor device 1 form a PIN diode D1.

The conductive layer 60 is provided on the semiconductor region 40. For example, the conductive layer 60 includes a metal material. For example, the conductive layer 60 contains metal of at least any of nickel(Ni), aluminum (Al), titanium(Ti), tungsten(W), molybdenum (Mo), copper(Cu), gold(Au), and platinum(Pt). In addition, the conductive layer 60 may be a metal silicide layer.

The conductive layer 60 is located between the semiconductor region 40 and the anode electrode 80, and is in contact with the semiconductor region 40 and the anode electrode 80. The semiconductor region 40 is in ohmic contact with the conductive layer 60. Since the conductive layer 60 is located between the semiconductor region 40 and the anode electrode 80, the electrical contact between the semiconductor region 40 and the anode electrode 80 is improved.

The anode electrode 80 is provided on the semiconductor regions 20, 30, and 31 and the conductive layer 60. The anode electrode 80 includes a metal material. For example, the anode electrode 80 contains metal of at least any of titanium, aluminum, nickel, tungsten, molybdenum, copper, gold, and platinum. The anode electrode 80 may be a stacked body containing a plurality of metals. On the anode electrode 80, for example, a wiring (not illustrated) such as a bonding wire is provided.

The cathode electrode 81 is provided on the second surface 10b of the semiconductor region 10. For example, the cathode electrode 81 is formed of a metal material, for example, the same metal material as that of the anode electrode 80.

As illustrated in FIG. 2, the semiconductor region 20 is in contact to the anode electrode 80 in region R1. The semiconductor region 20 is in Schottky-contact to the anode electrode 80. In the element region R1, the semiconductor region 20 in Schottky-contact to the anode electrode 80 forms a Schottky barrier diode (SBD).

In addition, the semiconductor region 20 interposed between the semiconductor regions 31 adjacent to each other in the X direction is in Schottky-contact to the anode electrode 80. In the element region R1, the semiconductor regions 20 and 31 of the semiconductor device 1 form a JBS (Junction Barrier Schottky) diode D2.

That is, in the element region R1 of the semiconductor device 1, the PIN diode D1 and the JBS diode D2 are provided together.

Next, the termination region R2 will be described.

In the termination region R2, the semiconductor device 1 includes the semiconductor regions 10, 20, 30, and 40, a semiconductor region 35 of the second conductivity type, the semiconductor region 51 of the first conductivity type, the conductive layer 60, the insulating layer 70, the anode electrode 80, and the cathode electrode 81.

The semiconductor region 20 is provided on the first surface 10a of the semiconductor region 10.

The semiconductor region 30 is provided on the semiconductor region 20. The portion of the semiconductor region 30 in the termination region R2 surrounds the element region R1, and has, for example, an annular shape when viewed from the Z direction.

The semiconductor region 40 is provided on or extends into the semiconductor region 30 in the termination region R2. The semiconductor region 40 in the termination region R2 surrounds the element region R1, and has, for example, an annular shape when viewed from the Z direction.

The semiconductor region 35 is provided on or extends into the semiconductor region 20 in the termination region R2. The semiconductor region 35 is adjacent to the semiconductor region 30 in the X direction. The semiconductor region 35 surrounds the element region R1, and has, for example, an annular shape when viewed from the Z direction. Further, the semiconductor region 35 is located outwardly of the semiconductor region 30 to surround, for example, the semiconductor region 30. For example, the depth of the semiconductor region 35 in the Z direction is substantially equal to the depth of the semiconductor region 30 in the Z direction. For example, the semiconductor region 35 contains silicon carbide and has a p⁻-type conductivity. The semiconductor region 35 is a reserve region, for example.

The semiconductor region 51 is provided on the semiconductor region 30 and extends into the semiconductor region 20. The semiconductor region 51 is located on the lower surface of the semiconductor region 30 and extends into the semiconductor region 20. For example, the semiconductor region 51 is located on the semiconductor region 30 to protrude therefrom in a direction opposite to the +Z direction. The semiconductor region 30 is interposed between the semiconductor region 40 and the semiconductor region 51.

The semiconductor region 51 surrounds the element region R1, and has, for example, an annular shape when viewed in the Z direction. For example, the semiconductor region 51 contains silicon carbide and has the n-type conductivity. For example, the conductivity type of the semiconductor region 51 is the same as the conductivity of the semiconductor region 50.

The semiconductor region 51 is formed by, for example, implanting n-type impurities into the semiconductor region 20 such as by the ion implantation method. In this case, the impurity concentration of the semiconductor region 51 becomes higher than that of the semiconductor region 20. The semiconductor region 51 has a width W2. In the example of FIG. 1, the width W2 is a width in the X direction, which is wider than the width W1.

In the termination region R2, the semiconductor regions 20, 30, 40, and 51 of the semiconductor device 1 form a PIN diode D1a.

The conductive layer 60 is provided on the semiconductor region 40 in the termination region R2. The conductive layer 60 surrounds the element region R1, and has, for example, an annular shape viewed in the Z direction.

The insulating layer 70 is provided on the semiconductor regions 20, 30, and 35 in the termination region R2. The insulating layer 70 surrounds the element region R1, and has, for example, an annular shape viewed in the Z direction. The insulating layer 70 contains, for example, silicon oxide (SiO). In addition, as illustrated in FIG. 2, a gap is provided between the conductive layer 60 and the insulating layer 70.

The anode electrode 80 is provided on the semiconductor region 30, the conductive layer 60, and the insulating layer 70 in the termination region R2. The anode electrode 80 is located over and inwardly of the location of the semiconductor region 30, and is provided, for example, over the semiconductor region 30 when viewed from the Z direction. Further, the anode electrode 80 extends outwardly of the semiconductor region 51, and overlies the semiconductor region 51 when viewed from the Z direction.

The cathode electrode 81 is located on the second surface 10b of the semiconductor region 10.

Next, effects of the embodiment will be described.

In the semiconductor device 1 of the embodiment, the semiconductor region 50 is provided in the PIN diode D1 of the element region R1, and the semiconductor region 51 is provided in the PIN diode D1a of the termination region R2. In addition, the width W1 of the semiconductor region 50 in the X direction is thinner than the width W2 of the semiconductor region 51 in the X direction.

Such semiconductor regions 50 and 51 are formed by implanting n-type impurities into the semiconductor region 20 so that the implantation amount of n-type impurities of the semiconductor region 50 is less than the implantation amount of n-type impurities of the semiconductor region 51. At this time, if the n-type impurities are implanted by the ion implantation method, for example, the implantation amount corresponds to the dose amount. That is, as compared to the implantation of n-type impurities of the semiconductor region 51, the semiconductor region 50 is formed by partially implanting n-type impurities into the semiconductor region 20. For example, the partial implantation into the semiconductor region 20 results in the formation of the semiconductor region 50, and thus the semiconductor region 50 has, for example, an annular shape when viewed from the Z direction.

In the embodiment, when such semiconductor regions 50 and 51 are provided, the breakdown voltage of the PIN diode D1 in the element region R1 is lower than the breakdown voltage of the PIN diode D1a in the termination region R2. For this reason, since breakdown occurs in a direction from the termination region R2 to the element region R1 (reverse breakdown), it is prevented that the device such as the PIN diode D1a is destroyed in the termination region R2. In other words, the destruction of the device in the termination region R2 is prevented by preventing the occurrence of breakdown in a direction from the element region R1 to the termination region R2 (forward breakdown). Therefore, it is possible to improve resistance with respect to a surge voltage in the termination region R2.

Further, in the embodiment, when the semiconductor regions 50 and 51 are provided, the semiconductor region 50 is partially formed, so that conductivity modulation is likely to occur in the PIN diode D1 in the element region R1. For this reason, it is possible to improve resistance with respect to the surge current in the element region R1.

According to the embodiment, it is possible to provide the semiconductor device with improved resistance.

Second Embodiment

Figure 3:
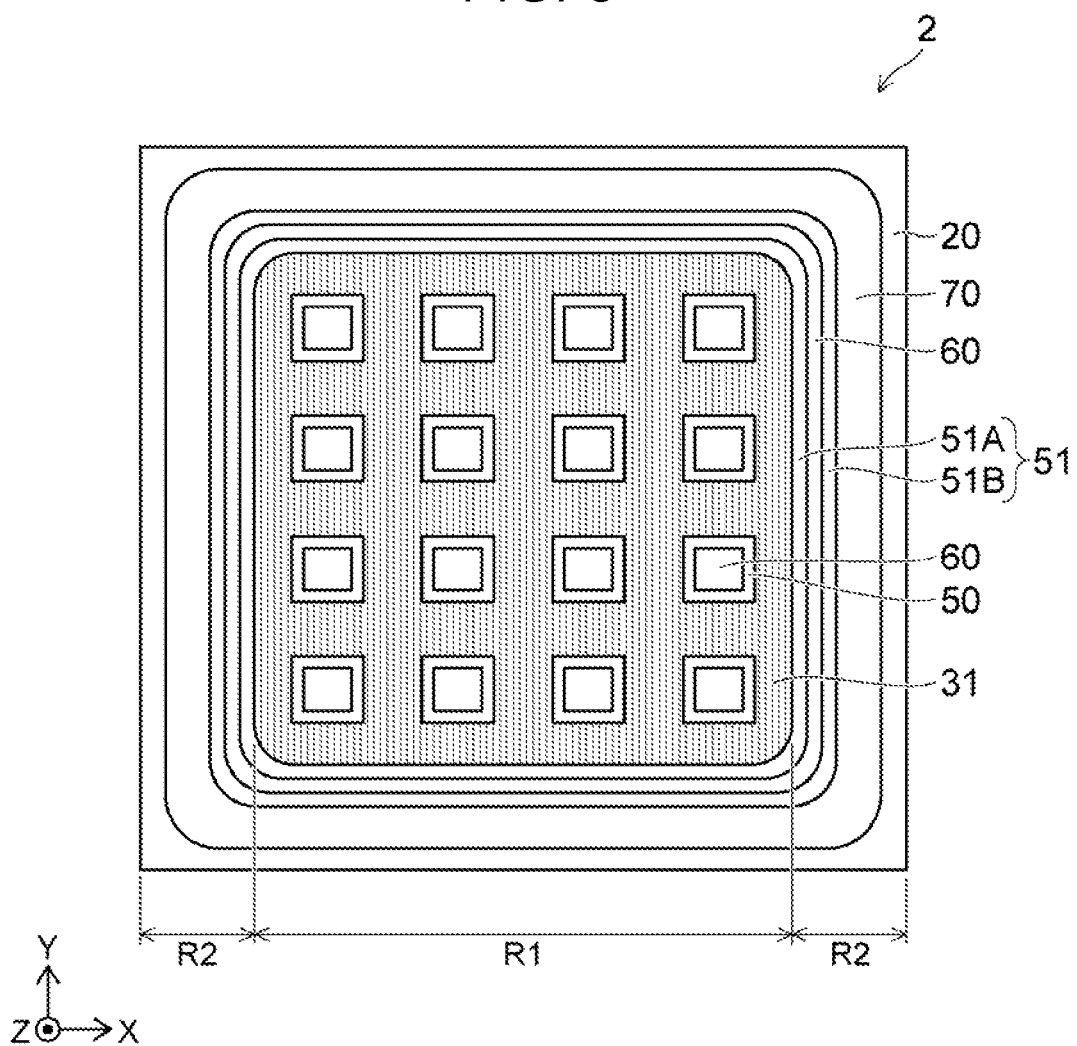
FIG. 3 is a plan view illustrating a semiconductor device according to a second embodiment.
Figure 4:
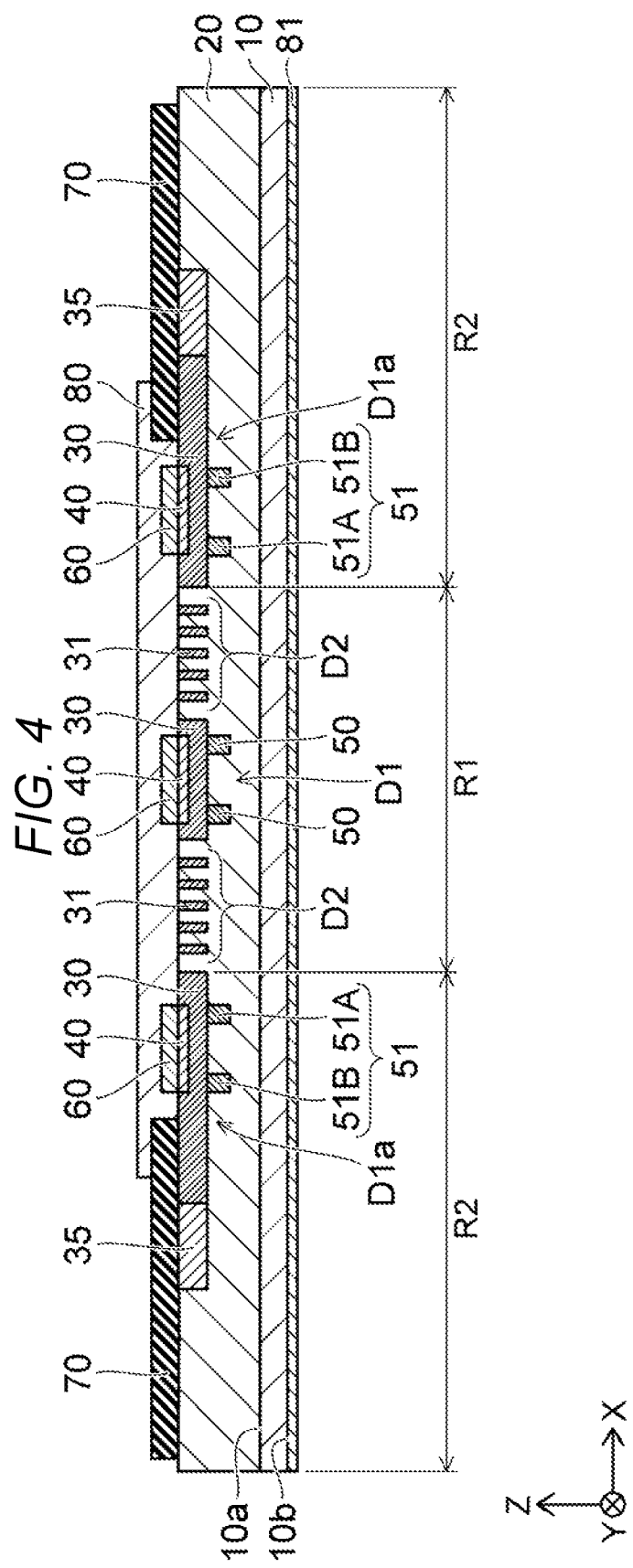
FIG. 4 is a sectional view illustrating the semiconductor device according to the second embodiment.

FIGS. 3 and 4 are a plan view and a sectional view illustrating a semiconductor device 2, respectively. Regions illustrated in FIGS. 3 and 4 correspond to the regions illustrated in FIGS. 1 and 2. For convenience of illustration, a portion of the components illustrated in FIG. 4 is omitted in FIG. 3. That is, in FIG. 3, positions of semiconductor regions 20, 31, 50, and 51, a conductive layer 60, and an insulating layer 70 in an element region R1 and a termination region R2 when viewed in the Z direction are shown.

It should be noted that the second embodiment is different from the first embodiment in the configuration of the semiconductor region 51. Accordingly, a description in detail of other elements will be omitted.

As illustrated in FIGS. 3 and 4, in the termination region R2, the semiconductor device 2 includes the semiconductor regions 10, 20, 30, 35, 40, and 51, the conductive layer 60, the insulating layer 70, an anode electrode 80, and a cathode electrode 81.

The semiconductor region 51 is provided on the semiconductor region 30 and extending into the semiconductor region 20. The semiconductor region 51 is located on the underside of the semiconductor region 30. For example, the semiconductor region 51 is located on the underside of the semiconductor region 30 extending therefrom in a direction opposite to the +Z direction. The semiconductor region 30 is interposed between the semiconductor region 40 and the semiconductor region 51.

The semiconductor region 51 includes a region 51A and a region 51B. As illustrated in FIG. 3, the regions 51A and 51B each form, for example, an annular shape when viewed in the Z direction. The region 51A is located closer to the element region R1 side than is the region 51B, and a portion of the semiconductor region 20 is located between the region 51A and the region 51B.

In addition, a portion of the conductive layer 60 between the region 51A and the region 51B of the semiconductor region 51 illustrated in FIG. 4 is shown in FIG. 3. As illustrated in FIG. 4, a gap is provided between the conductive layer 60 and the insulating layer 70.

In the termination region R2, the semiconductor regions 20, 30, and 40 of the semiconductor device 2, and the semiconductor region 51 including the regions 51A and 51B form a PIN diode D1a.

The effects of the embodiment are the same as those of the first embodiment.

As described above, in the semiconductor device according to the embodiments, the first conductivity type is an n type and the second conductivity type is a p type as an example. However, the first conductivity type may be a p type and the second conductivity type may be an n type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device having a first region and a second region surrounding the first region, comprising:
   a first electrode extending across the first and second regions;
   a second electrode extending across the first region and at least into the second region;
   a first semiconductor layer of a first conductivity type located between the first electrode and the second electrode, the first semiconductor layer extending across the first region and the second region;
   a second semiconductor layer of the first conductivity type located over the first semiconductor layer in the first and second regions, and contacting the second electrode in the first region;
   a third semiconductor layer of a second conductivity type located over the second semiconductor layer in the first region;
   a fourth semiconductor layer of the first conductivity type located between the third semiconductor layer and the second semiconductor layer;
   a fifth semiconductor layer of the second conductivity type located on the second semiconductor layer in the second region; and
   a sixth semiconductor layer of the first conductivity type located between the fifth semiconductor layer and the second semiconductor layer, wherein
   the width of the fourth semiconductor layer in the direction between the first and second regions is less than the width of the sixth semiconductor layer in the direction between the first and second regions, and
   the fourth semiconductor layer surrounds a portion of the second semiconductor layer contacting the third semiconductor layer, wherein the first conductivity type is different from the second conductivity type.

2. The semiconductor device of claim 1, wherein the fourth semiconductor layer has an annular shape.

3. The semiconductor device of claim 1, further comprising:
   a seventh semiconductor layer located on the second semiconductor layer in the first region, and between the third semiconductor layer and the fifth semiconductor layer.

4. The semiconductor device of claim 3, wherein the seventh semiconductor layer surrounds the third and fourth semiconductor layers.

5. The semiconductor device of claim 1, wherein the fifth semiconductor layer surrounds the first region.

6. The semiconductor device of claim 1, further comprising:
   an eighth semiconductor layer of the second conductivity type located on the fifth semiconductor layer; and
   a conductive layer located on the eighth semiconductor layer and contacting the second electrode in the second region.

7. The semiconductor device of claim 6, further comprising:
   a ninth semiconductor layer located on the second semiconductor layer and surrounding the fifth semiconductor layer.

8. The semiconductor device according to claim 1, wherein the sixth semiconductor layer includes a first portion surrounding the first region, and a second portion, surrounding the first portion.

9. A semiconductor device having a first region and a second region surrounding the first region, comprising:
   a first electrode;
   a first semiconductor layer of a first conductivity type on the first electrode;
   a second semiconductor layer of the first conductivity type on the first semiconductor layer;
   a second electrode on the second semiconductor layer;
   at least one first PIN diode comprising a portion of the first and second semiconductor layers located in the first region; and
   at least one second PIN diode comprising a portion of the first and second semiconductor layers located in the second region, wherein
   the at least one second PIN diode surrounds the first region,
   the at least one PIN diode further comprises:
      a third semiconductor layer of a second conductivity type on the second semiconductor layer;
      a fourth semiconductor layer of the second conductivity type on the third semiconductor layer; and
      a fifth semiconductor layer of the first conductivity type extending inwardly of the second semiconductor layer from the third semiconductor layer, and
   the fifth semiconductor layer surrounds at least a portion of the second semiconductor layer contacting the third semiconductor layer, wherein the first conductivity type is different from the second conductivity type.

10. The semiconductor device of claim 9, further comprising:
    at least one junction Schottky barrier diode comprising a portion of the second semiconductor layer in the first region, the at least one junction barrier Schottky diode contacting the second electrode in the first region.

11. The semiconductor device of claim 10, wherein the at least one junction barrier Schottky diode surrounds the at least one first PIN diode.

12. The semiconductor device of claim 11, wherein a plurality of first PIN diodes contact the second electrode in the first region.

13. The semiconductor device of claim 9, further comprising:
a sixth semiconductor layer of the second conductivity type on the second semiconductor layer;
a seventh semiconductor layer of the second conductivity type on the sixth semiconductor layer; and
an eighth semiconductor layer of the first conductivity type extending inwardly of the second semiconductor layer from the sixth semiconductor layer.

14. The semiconductor device of claim 13, wherein
the eighth semiconductor layer includes a first portion surrounding the first region, and a second portion surrounding the first portion, and
a portion of the second semiconductor layer extends between the first and second portion of the eighth semiconductor layer.

15. The semiconductor device according to claim 9, further comprising:
a first conductor layer on the fourth semiconductor layer, wherein
the first conductor and a portion of the third semiconductor layer contact the second electrode in the first region.

16. The semiconductor device of claim 13, further comprising:
a second conductive layer on the seventh semiconductor layer, wherein
the second conductive layer and portions of the sixth semiconductor layer contact the second electrode in the second region.

17. The semiconductor device of claim 16, further comprising:
a ninth semiconductor layer of the second conductivity type surrounding the sixth semiconductor layer.

18. The semiconductor divide of claim 9, wherein the at least one junction barrier Schottky diode includes a first portion surrounding the at least one first PIN diode.

19. A semiconductor device having a first region and a second region surrounding the first region, comprising:
a first electrode extending across the first and second regions;
a second electrode extending across the first region and at least into the second region;
a first semiconductor layer of a first conductivity type located between the first electrode and the second electrode, the first semiconductor layer extending across the first region and the second region;
a second semiconductor layer of the first conductivity type located over the first semiconductor layer in the first and second regions, and contacting the second electrode in the first region;
a third semiconductor layer of a second conductivity type located over the second semiconductor layer in the first region;
a fourth semiconductor layer of the first conductivity type located between the third semiconductor layer and the second semiconductor layer;
a fifth semiconductor layer of the second conductivity type located on the second semiconductor layer in the second region; and
a sixth semiconductor layer of the first conductivity type located between the fifth semiconductor layer and the second semiconductor layer, wherein
the width of the fourth semiconductor layer in the direction between the first and second regions is less than the width of the sixth semiconductor layer in the direction between the first and second regions, and
the sixth semiconductor layer includes a first portion surrounding the first region, and a second portion, surrounding the first portion, wherein the first conductivity type is different from the second conductivity type.

* * * * *